(12) United States Patent
Avila et al.

(10) Patent No.: US 8,972,675 B2
(45) Date of Patent: *Mar. 3, 2015

(54) EFFICIENT POST WRITE READ IN THREE DIMENSIONAL NONVOLATILE MEMORY

(71) Applicant: SanDisk Technologies Inc., Plano, TX (US)

(72) Inventors: Chris Avila, Saratoga, CA (US); Gautam A. Dusija, Milpitas, CA (US); Jian Chen, Menlo Park, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/280,282

(22) Filed: May 16, 2014

(65) Prior Publication Data

US 2015/0006790 A1  Jan. 1, 2015

Related U.S. Application Data

(63) Continuation of application No. 13/929,368, filed on Jun. 27, 2013.

(51) Int. Cl.
| | |
|---|---|
| G06F 12/00 | (2006.01) |
| G06F 13/00 | (2006.01) |
| G06F 13/28 | (2006.01) |
| G06F 12/02 | (2006.01) |
| G11C 16/34 | (2006.01) |
| G11C 29/00 | (2006.01) |

(52) U.S. Cl.
CPC .... G06F 12/0246 (2013.01); *G11C 2211/5641* (2013.01); *G11C 16/3418* (2013.01); *G11C 2211/5621* (2013.01); *G11C 16/3459* (2013.01); *G11C 16/3454* (2013.01); *G11C 29/00* (2013.01)
USPC .......................................... 711/154; 711/111

(58) Field of Classification Search
CPC ............... G11C 2211/5641; G11C 2211/5621; G11C 16/3454; G11C 16/3418; G11C 16/3459; G11C 29/00
USPC .................................................. 711/154, 111
See application file for complete search history.

(56) References Cited

U.S. PATENT DOCUMENTS

| | | | |
|---|---|---|---|
| 5,070,032 | A | 12/1991 | Yuan et al. |
| 5,095,344 | A | 3/1992 | Harari |
| 5,313,421 | A | 5/1994 | Guterman et al. |

(Continued)

FOREIGN PATENT DOCUMENTS

| | | |
|---|---|---|
| WO | WO2012087411 | 6/2012 |
| WO | WO 2012/158521 | 11/2012 |
| WO | WO2012174216 | 12/2012 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Ryan Bertram
(74) *Attorney, Agent, or Firm* — Davis Wright Tremaine LLP

(57) ABSTRACT

Data that is stored in a higher error rate format in a 3-D nonvolatile memory is backed up in a lower error rate format. Later, the higher error rate copy is sampled to determine if it is acceptable. A sampling pattern samples all word lines of a string and at least one word line of each string of the block.

24 Claims, 15 Drawing Sheets

(56) References Cited

U.S. PATENT DOCUMENTS

| | | | |
|---|---|---|---|
| 5,315,541 A | 5/1994 | Harari et al. | |
| 5,343,063 A | 8/1994 | Yuan et al. | |
| 5,570,315 A | 10/1996 | Tanaka et al. | |
| 5,661,053 A | 8/1997 | Yuan | |
| 5,768,192 A | 6/1998 | Eitan | |
| 5,774,397 A | 6/1998 | Endoh et al. | |
| 5,903,495 A | 5/1999 | Takeuchi et al. | |
| 6,011,725 A | 1/2000 | Eitan | |
| 6,046,935 A | 4/2000 | Takeuchi et al. | |
| 6,222,762 B1 | 4/2001 | Guterman et al. | |
| 7,016,226 B2 | 3/2006 | Shibata et al. | |
| 7,057,939 B2 | 6/2006 | Li et al. | |
| 7,120,051 B2 | 10/2006 | Gorobets et al. | |
| 7,315,916 B2 | 1/2008 | Bennett et al. | |
| 7,505,320 B2 | 3/2009 | Li | |
| 7,508,721 B2 | 3/2009 | Li et al. | |
| 8,027,195 B2 | 9/2011 | Li et al. | |
| 8,094,400 B1 | 1/2012 | Han | |
| 8,144,512 B2 | 3/2012 | Huang et al. | |
| 8,214,700 B2 | 7/2012 | Chen | |
| 8,244,960 B2 | 8/2012 | Paley et al. | |
| 8,307,241 B2 | 11/2012 | Avila et al. | |
| 8,472,280 B2 | 6/2013 | Li | |
| 8,566,671 B1 | 10/2013 | Ye et al. | |
| 8,750,042 B2* | 6/2014 | Sharon et al. | 365/185.09 |
| 2007/0109858 A1* | 5/2007 | Conley et al. | 365/185.11 |
| 2010/0174847 A1 | 7/2010 | Paley et al. | |
| 2010/0318721 A1 | 12/2010 | Avila et al. | |
| 2010/0318839 A1 | 12/2010 | Avila et al. | |
| 2011/0072332 A1 | 3/2011 | Tomlin | |
| 2011/0096601 A1* | 4/2011 | Gavens et al. | 365/185.09 |
| 2011/0099418 A1* | 4/2011 | Chen | 714/6.24 |
| 2011/0099460 A1* | 4/2011 | Dusija et al. | 714/773 |
| 2011/0149650 A1 | 6/2011 | Huang et al. | |
| 2011/0153912 A1 | 6/2011 | Gorobets et al. | |
| 2011/0267885 A1 | 11/2011 | Kato | |
| 2012/0001247 A1* | 1/2012 | Alsmeier | 257/316 |
| 2012/0182803 A1 | 7/2012 | Shirakawa | |
| 2012/0256247 A1 | 10/2012 | Alsmeier | |
| 2012/0272120 A1* | 10/2012 | Chen | 714/758 |
| 2012/0287710 A1 | 11/2012 | Shirakawa | |
| 2012/0297122 A1 | 11/2012 | Gorobets et al. | |
| 2012/0311244 A1 | 12/2012 | Huang et al. | |
| 2013/0024605 A1 | 1/2013 | Sharon et al. | |
| 2013/0028021 A1* | 1/2013 | Sharon et al. | 365/185.17 |
| 2013/0031429 A1 | 1/2013 | Sharon et al. | |
| 2013/0031430 A1* | 1/2013 | Sharon | 714/719 |
| 2013/0031431 A1* | 1/2013 | Sharon et al. | 714/719 |
| 2013/0107628 A1 | 5/2013 | Dong et al. | |
| 2013/0155769 A1 | 6/2013 | Li et al. | |
| 2013/0220088 A1 | 8/2013 | Horn et al. | |

OTHER PUBLICATIONS

Notification of Transmittal of the International Search Report and the Written Opinion of the International Searching Authority, or the Declaration for Int'l Application No. US2014/043153 mailed Oct. 9, 2014, 11 pages.

U.S. Appl. No. 13/934,013, entitled Write Operations for Defect Management in Nonvolatile Memory, filed Jul. 2, 2013, 47 pages.

U.S. Appl. No. 14/097,523, entitled Systems and Methods for Partial Page Programming of Multi Level Cells, filed Dec. 5, 2013, 41 pages.

U.S. Appl. No. 14/086,162, entitled Update Block Programming Order, filed Nov. 21, 2013, 45 pages.

U.S. Appl. No. 13/929,368, entitled Efficient Post Write Read in Three Dimensional Nonvolatile Memory, filed Jun. 27, 2013, 49 pages.

U.S. Appl. No. 14/099,027 entitled "Lower Page Only Host Burst Writes," filed Dec. 6, 2013, 46 pages.

U.S. Appl. No. 13/788,415 entitled Write Sequence Providing Write Abort Protection, filed Mar. 7, 2013, 36 pages.

U.S. Appl. No. 14/094,550 entitled "Multi-Die Write Management," filed Dec. 2, 2013, 32 pages.

* cited by examiner

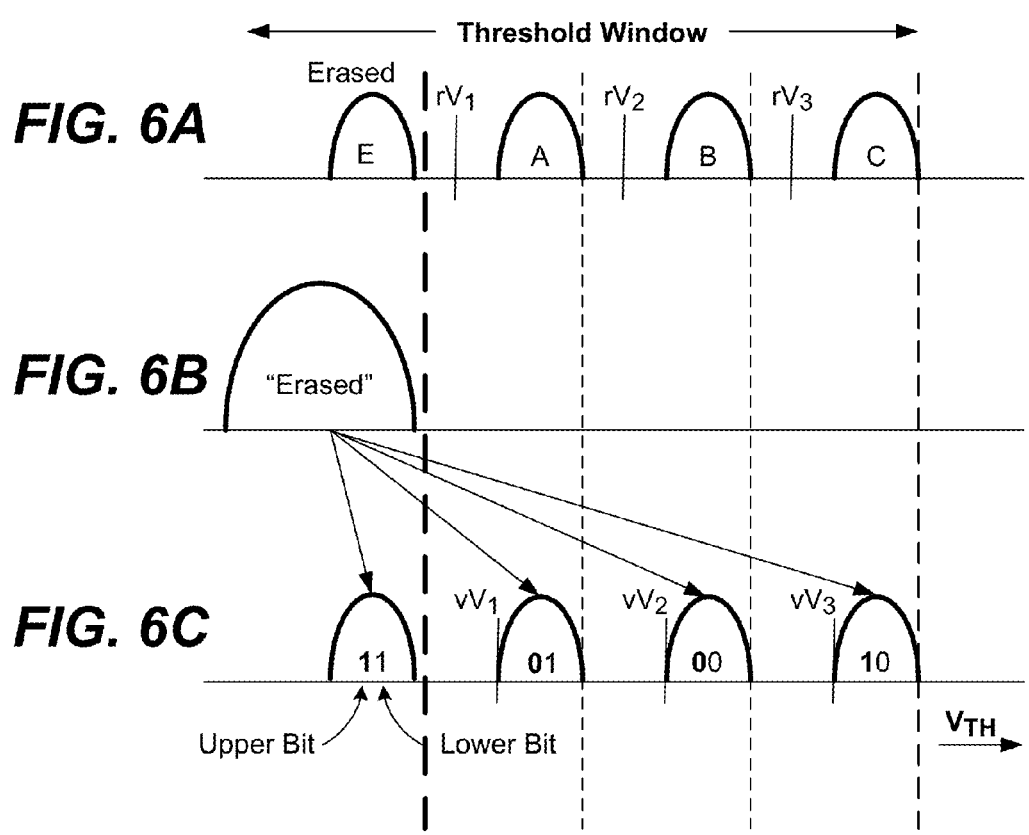
Programming into four states represented by a 2-bit code

FIG. 11C

EFFICIENT POST WRITE READ IN THREE DIMENSIONAL NONVOLATILE MEMORY

CROSS-RELATED APPLICATION

This application is a continuation of U.S. application Ser. No. 13/929,368 filed Jun. 27, 2013, which application is incorporated herein in its entirety by this reference.

BACKGROUND

This application relates to the operation of three dimensional re-programmable non-volatile memory systems and to systems and methods for ensuring that data is efficiently and accurately stored in such nonvolatile memory systems.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into its memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row, or word line typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY OF THE INVENTION

A three dimensional nonvolatile memory array stores copies of incoming data in two different formats, one having a higher density and higher error rate (e.g. MLC) and one having a lower density and lower error rate (e.g. SLC). Later, the higher density copy is compared with the lower density copy to determine if the higher density copy is acceptable before the lower density copy is erased. Rather than compare all the data in a block using the higher density format, the higher density block may be sampled so that the read and compare times are significantly reduced. A sampling pattern samples all word lines of a string and at least one word line of each string of the block. Such a sampling pattern is sufficient to detect many likely failure modes while keeping the read and compare times relatively small.

An example of a method of operating a 3-D nonvolatile memory array includes: writing data in a first format in a plurality of separately selectable sets of strings of a first block; writing the data in a second format in at least a second block; subsequently sampling the data written in the first format from the first block, sample data including: (i) data of all word lines of a sample set of strings and (ii) a sample word line of each of the sets of strings of the plurality; if the sampled data meets a standard, then discarding the data written in the second format in the at least a second block; and if the sampled data does not meet the standard, then discarding the data in the first format in the first block.

If the sample data does not meet the standard, then the data in the second format from the at least a second block may be used as a source to write the data in the first format in a third block. The standard may require that fewer than a threshold number of bits of the sample data are different to corresponding bits of the data written in the second format from the at least a second block. The first format may produce a higher error rate than the second format. The first format may be a Multi Level Cell (MLC) format and the second format may be a Single Level Cell (SLC) format. The first format may be an MLC format that stores n-bits per cell, where n=2, 3, 4, or more, and the second format may be an SLC format or an MLC format that stores n-bits or fewer than n-bits per cell. The first format may include a lower bit and an upper bit in a memory cell and the sample data may include both lower bits and upper bits. The first format may include a lower bit and an upper bit in a memory cell and the sample data may consist of upper bits. The first format may be a two-bit per cell MLC format and the at least a second block may consist of two SLC blocks. The sampling may be performed in response to determining that a number of erased blocks remaining in the 3-D nonvolatile memory array is less than a threshold number. The word lines may be written in a predetermined order and the sample word line may be the first written word line according to the predetermined order. The first block may share a block select circuit with a third block, and the first and third blocks may be sampled together after they are both fully written. The third block may be sampled such that sample data includes: (i) data of all word lines of a sample set of strings of the third block and (ii) a sample word line of each set of strings of the third block.

An example of a 3-D nonvolatile memory array includes: a plurality of individually erasable blocks, a block including a plurality of strings connected to each bit line of the block, each string along a bit line being selectable by a different select line so that an individual select line selects a set of strings of different bit lines; a write circuit that is configured to write data in a first set of blocks in a first format and to write the data to a second set of blocks in a second format; a sampling circuit that is configured to sample the data in the first format from a block of the first set of blocks, sample data including (i) all word lines of a sample set of strings in the block, and (ii) a sample word line of each set of strings of the block; a determination circuit that is configured to determine whether the sample data meets a standard; and a block reclaim circuit that is configured to reclaim a portion of the second set of blocks containing the data in the second format if the sample data meets the standard, and configured to reclaim a portion of the first set of blocks containing the data in the first format if the sample data does not meet the standard.

A data copying circuit may be configured to use the data in the second format in the second set of blocks as a source to write the data in the first set of blocks in the first format. The determination circuit may be configured to compare the sample data with corresponding portions of data from the second set of blocks to identify a number of bits that are different and to compare the number with a threshold number. The second format may provide a lower error rate than the first format. The first format may be a Multi Level Cell (MLC) format and the second format may be a Single Level Cell (SLC) format. The first format may be an MLC format that stores n-bits per cell, where n=2, 3, 4, or more, and the second format may be an SLC format or an MLC format that stores n-bits or fewer than n-bits per cell.

The first format may include a lower bit and an upper bit in each memory cell and the sampling circuit may be configured to sample both lower bits and upper bits. The first format may include a lower bit and an upper bit in each memory cell and the sampling circuit may be configured to sample only upper bits. The first format may be a two-bit per cell MLC format and the at least a second block may consist of two SLC blocks. The sampling circuit may perform sampling in response to determining that a number of erased blocks remaining in the 3-D nonvolatile memory array is less than a threshold number. Word lines may be written in a predetermined order and the sample word line may be the first written word line according to the predetermined order. The plurality of individually erasable blocks may be arranged in pairs, with each pair of blocks sharing a block select circuit, and the sampling circuit may be configured to sample the data in the first format from a pair of blocks together. The sampling circuit may be configured to sample a pair of blocks such that sample data includes: (i) data of all word lines of a sample set of strings in each block and (ii) a sample word line of each set of strings of each blocks.

An example of a method of operating a 3-D nonvolatile memory array in which pairs of blocks share block select circuits includes: writing data in a first format in a plurality of separately selectable sets of strings of a first block and a second block that share block select circuits; writing the data in a second format in at least a third block; subsequently, after the first and second blocks are fully written, sampling the data written in the first format from the first and second blocks, sample data including: (i) data of all word lines of a first sample set of strings of the first block and data of all word lines of a second sample set of strings of the second block, and (ii) a sample word line of each of the sets of strings of the first block and a sample word line of each of the sets of strings of the second block; if the sampled data meets a standard, then discarding the data written in the second format in the at least a third block; and if the sampled data does not meet the standard, then discarding the data in the first format in the first and second blocks. Writing the data in the first format may consist of writing at least two two-bit per cell MLC format blocks and writing the data in the second format may consist of writing at least four SLC blocks.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 6A-6C illustrate an example of programming a population of 4-state memory cells.

FIG. 11C is a schematic representation of a sampling pattern for sampling data of a block in a diagonal pattern.

DETAILED DESCRIPTION

Memory System

Figure 1:
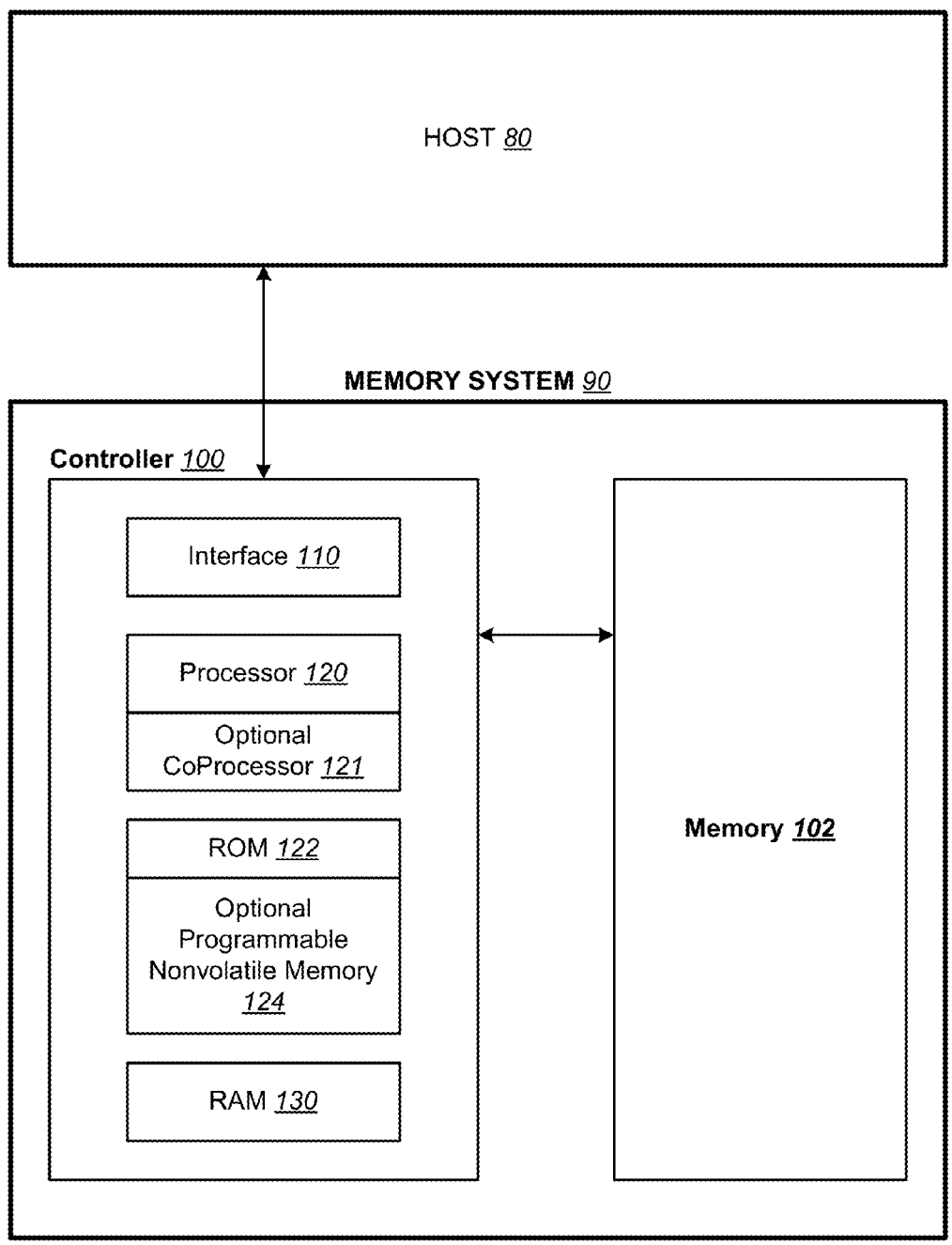
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. A controller is typically formed as an ASIC (application specific integrated circuit) and the components included in such an ASIC generally depend on the particular application.

Physical Memory Structure

Figure 2:
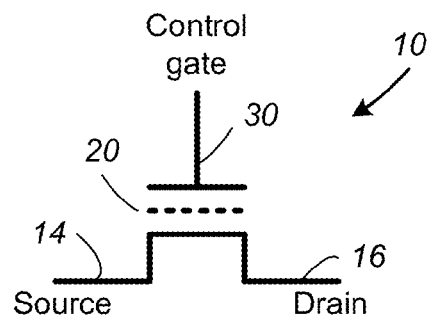
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
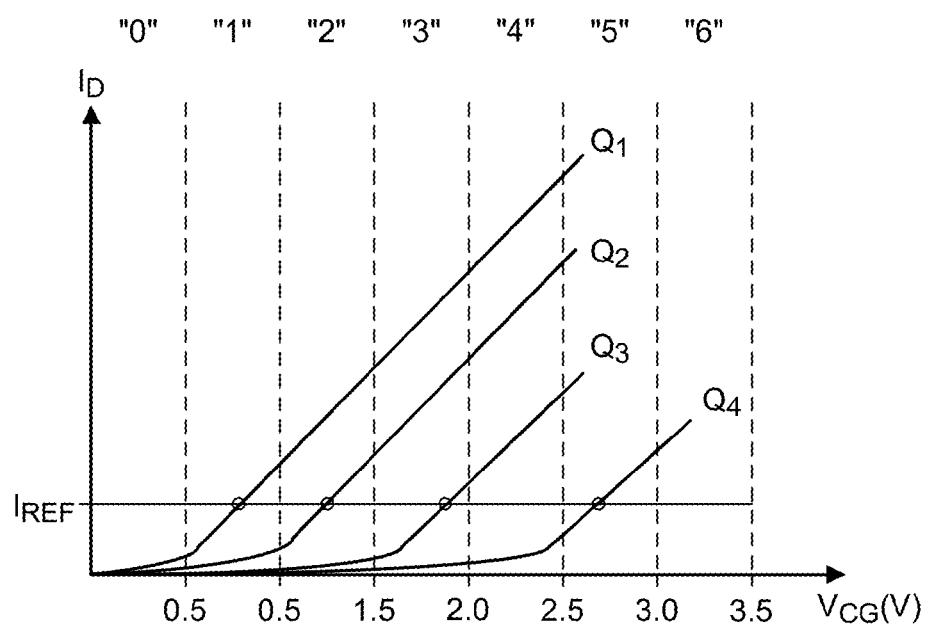
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four charge levels that can be programmed on a floating gate of a memory cell, respectively corresponding to four of eight possible memory states. As an example, the threshold voltage window of a population of cells may range from 0.5V to 3.5V. Seven programmed memory states "0", "1", "2", "3", "4", "5", "6", respectively, and one erased state (not shown), may be demarcated by partitioning the threshold window into regions in intervals of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
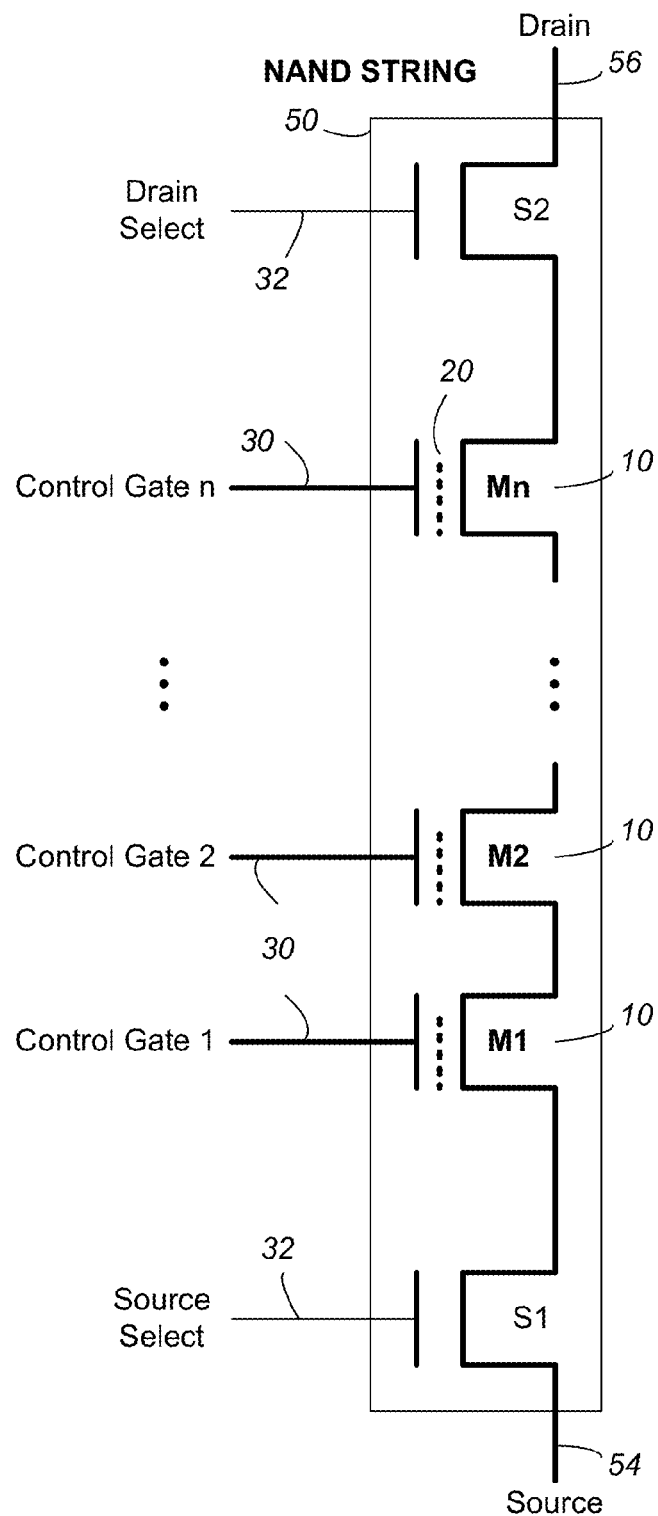
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
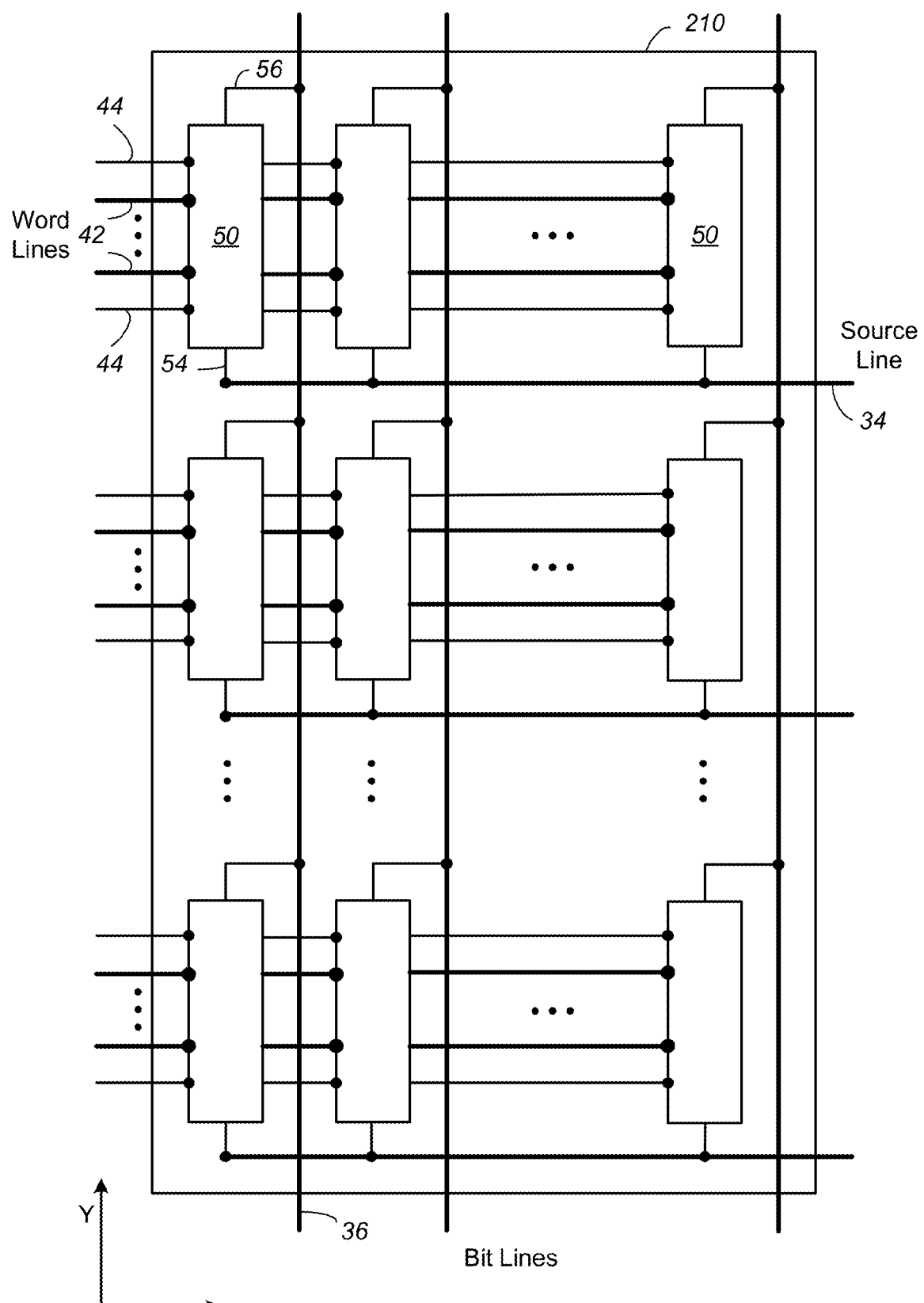
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
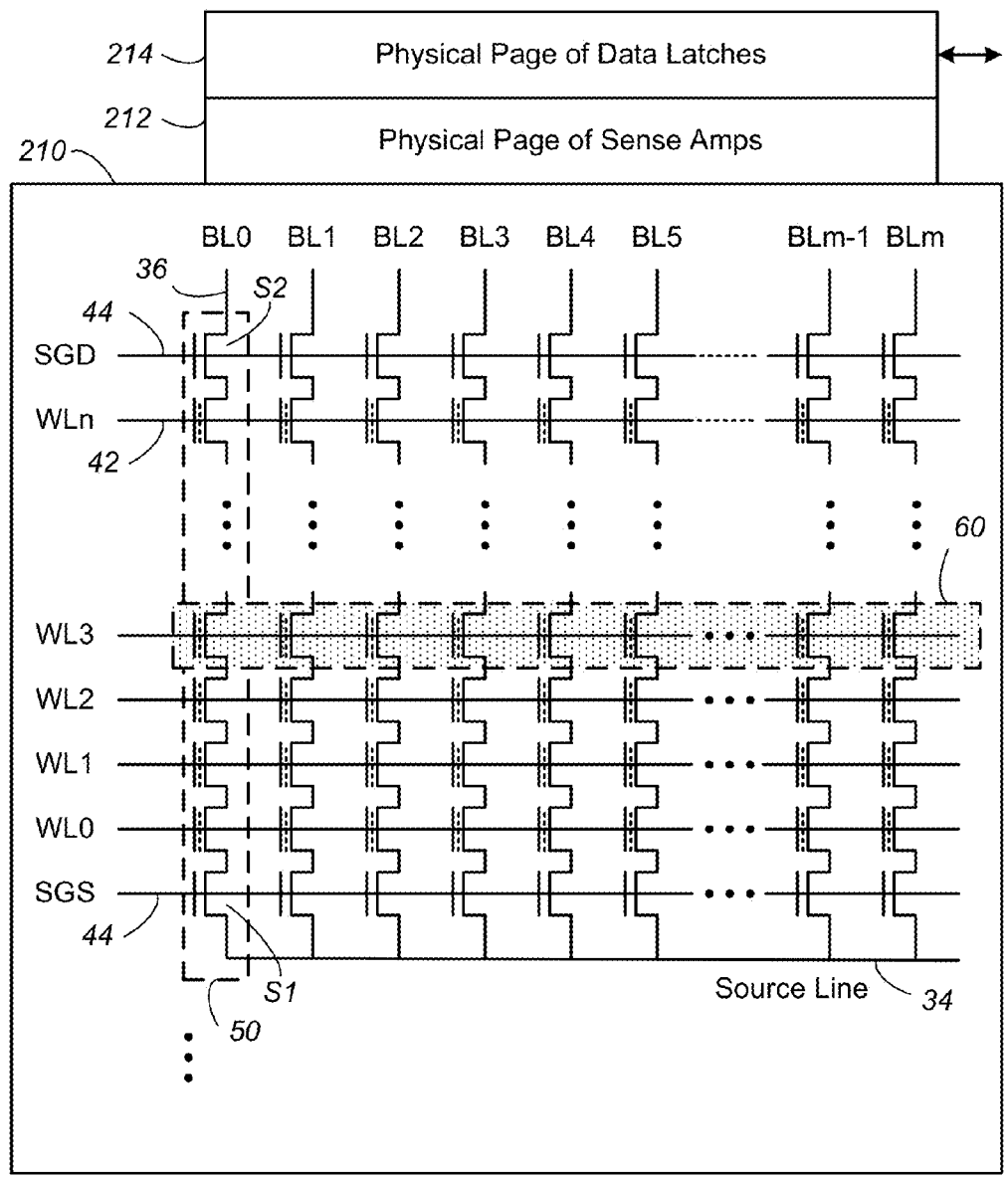
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that update data cannot overwrite existing one and must be written to a previous unwritten location.

Erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

FIG. 6A-6C illustrate an example of programming a population of 4-state memory cells. FIG. 6A illustrates the population of memory cells programmable into four distinct distributions of threshold voltages respectively representing memory states "0", "1", "2" and "3". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three subpasses respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088 and in U.S. Patent Publication Number 2013/0107628, which are hereby incorporated by reference in their entirety.

Figure 7:
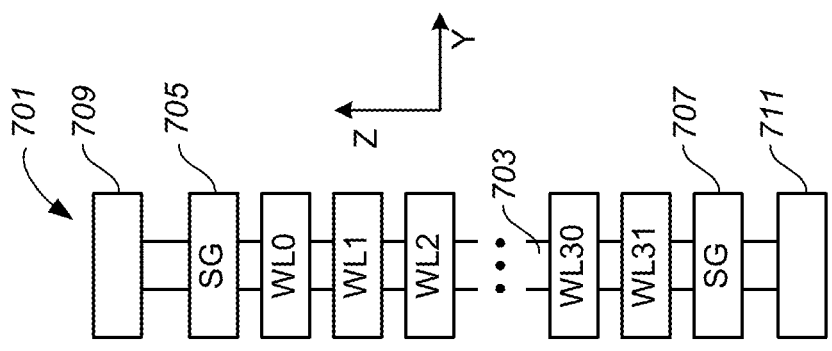
FIG. 7 illustrates an example of a NAND string that extends vertically from a substrate in the z-direction.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

Figure 8:
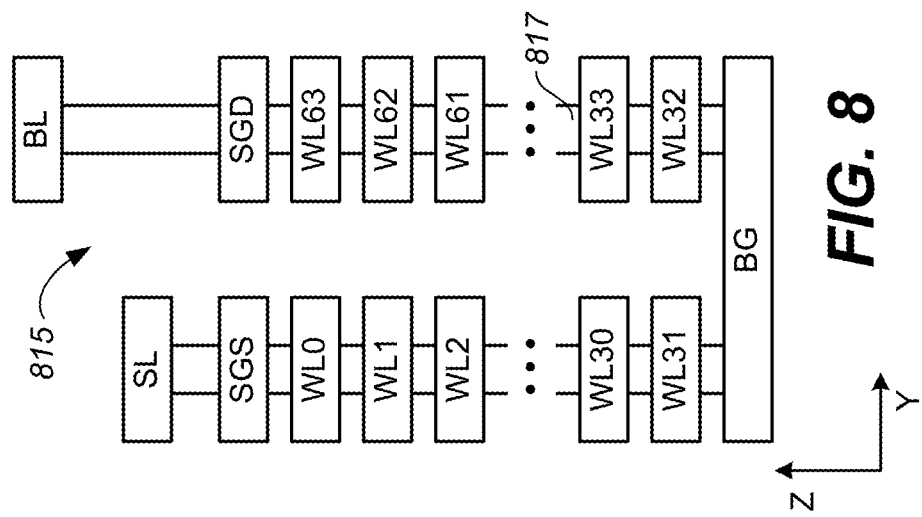
FIG. 8 illustrates another example of a NAND string that extends vertically from a substrate in the z-direction.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two sides of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9A:
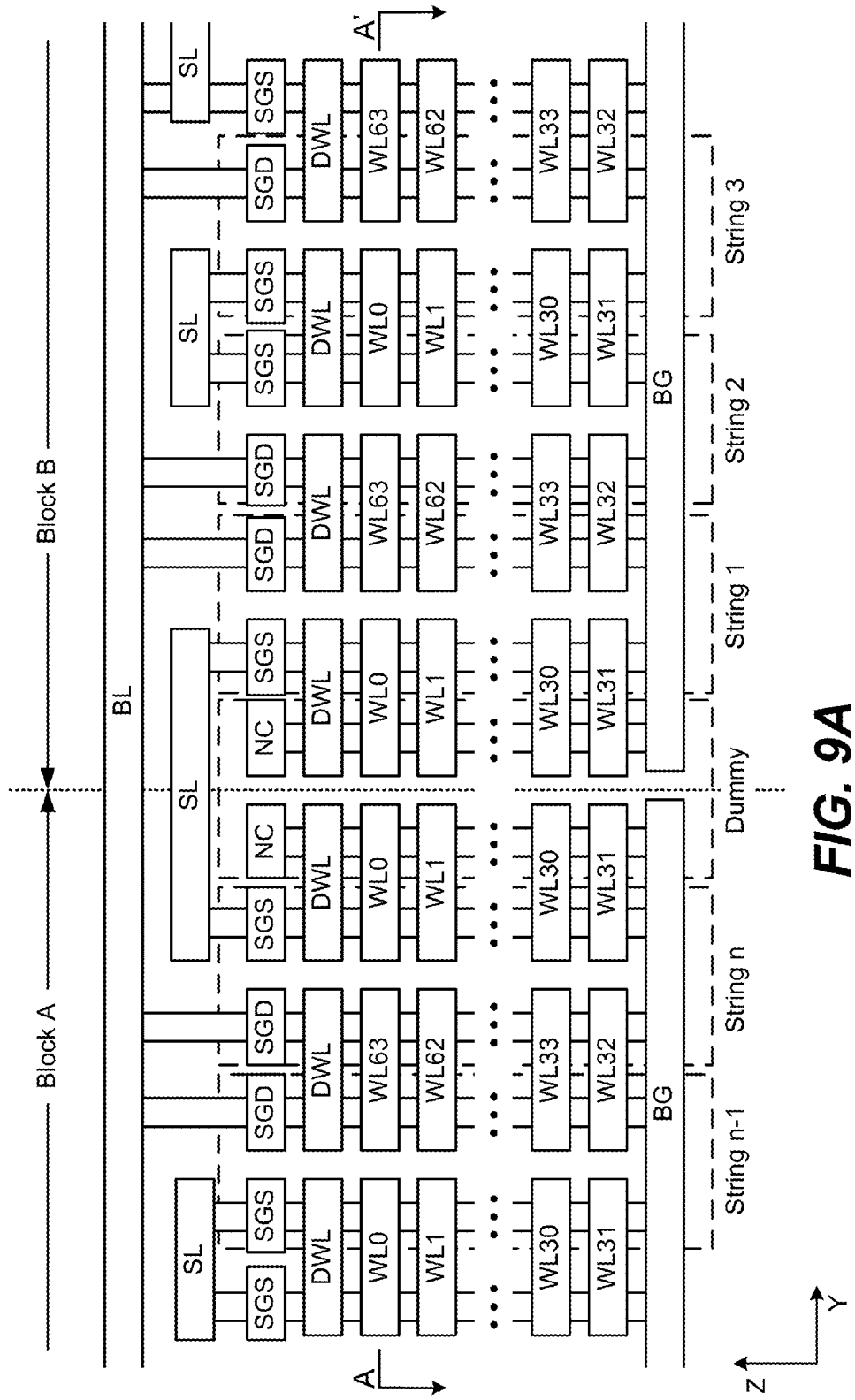
FIG. 9A shows an example of a 3-D NAND memory array in cross section along the y-z plane.

Vertical NAND strings may be arranged to form a 3-D NAND array in various ways. FIG. 9A shows an example where multiple U-shaped NAND strings in a block are connected to a bit line. In this case, there are n strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

FIG. 9A shows some details of the structure of a block that is made up of U-shaped vertical NAND strings. Block A contains n strings connected to the bit line BL. While only strings n, and n−1 of Block A are shown, it will be understood that the repetitive structure continues to the left where strings 1 to n−2 are located. Block B contains n strings connected to bit line BL. While only strings 1-3 of Block B are shown, it will be understood that the repetitive structure continues to the right where strings 4 to n are located. It will also be understood that the cross section shown is along one of many bit lines that serve the block and that there are many similar bit lines that extend along the y-direction, and are separated from each other along the x-direction (e.g. are behind the bit line shown in FIG. 9A). Word lines extend along the x-direction, perpendicular to the plane of FIG. 9A, to connect sets of strings of different bit lines. Similarly, select lines extend in the x-direction so that a set of strings may be selectively connected, or isolated, as a unit. In the example shown, word lines are formed so that a single conductive strip forms a word line of two adjacent strings. Thus, for example, in Block B, string 1 and string 2 have word lines WL32-WL63 that are formed by common conductive strips. In contrast, select lines are not shared between neighboring strings. This allows separate selection of an individual set of strings within a block, even though the selected set of strings may include word lines that are not separately controllable from word lines of unselected strings.

FIG. 9A shows dummy word lines "DWL" separating select lines SGD, SGS, from host data word lines WL0-WL63. While host data word lines are used to store host data (i.e. data that may be sent to the memory from an external source with the expectation that the data will be returned in response to a read command), dummy word lines do not store host data. They may store nothing, or may store some dummy data that puts the dummy cells in a desirable condition (e.g. puts their threshold voltages at levels that make accessing other cells easier, or reduces risk of disturbance). The dummy word lines shown provide some protection for stored data. In particular, the word line closest to the select gate may be vulnerable to data disturbance because of its proximity to the select gate. By making this word line a dummy word line, the danger of disturbing host data is reduced. In some cases, two or more dummy word lines may be provided between a select line and host data word lines because the risk of disturbance extends more than one word line from the select line. Dummy word lines may be located at other locations besides the single location shown. One or more dummy word lines may be located between host data word lines and the back gate ("BG") for example. Dummy word lines generally have the same physical structure as host data word lines so that the number and location of dummy word lines may be configurable for any given array structure.

Where Block A and Block B meet, there are dummy memory cells in both blocks (i.e. between String n of Block A and String 1 of Block B). Half a NAND string of dummy cells is provided in each block in this example so that host data word lines of the two blocks are separated by two dummy word lines. This is to reduce disturbance that might occur if host data word lines of different blocks were immediately adjacent to each other. Dummy select lines, which are not connected to control circuits (marked "NC" for "not connected") are also provided where neighboring blocks meet in this example. Different arrangements of dummy word lines, and other dummy structures between blocks are possible according to memory design and operating requirements. For example, select lines may be connected, back gates of neighboring blocks may be in closer proximity than shown, dummy word lines may be connected in different ways, etc.

Figure 9B:
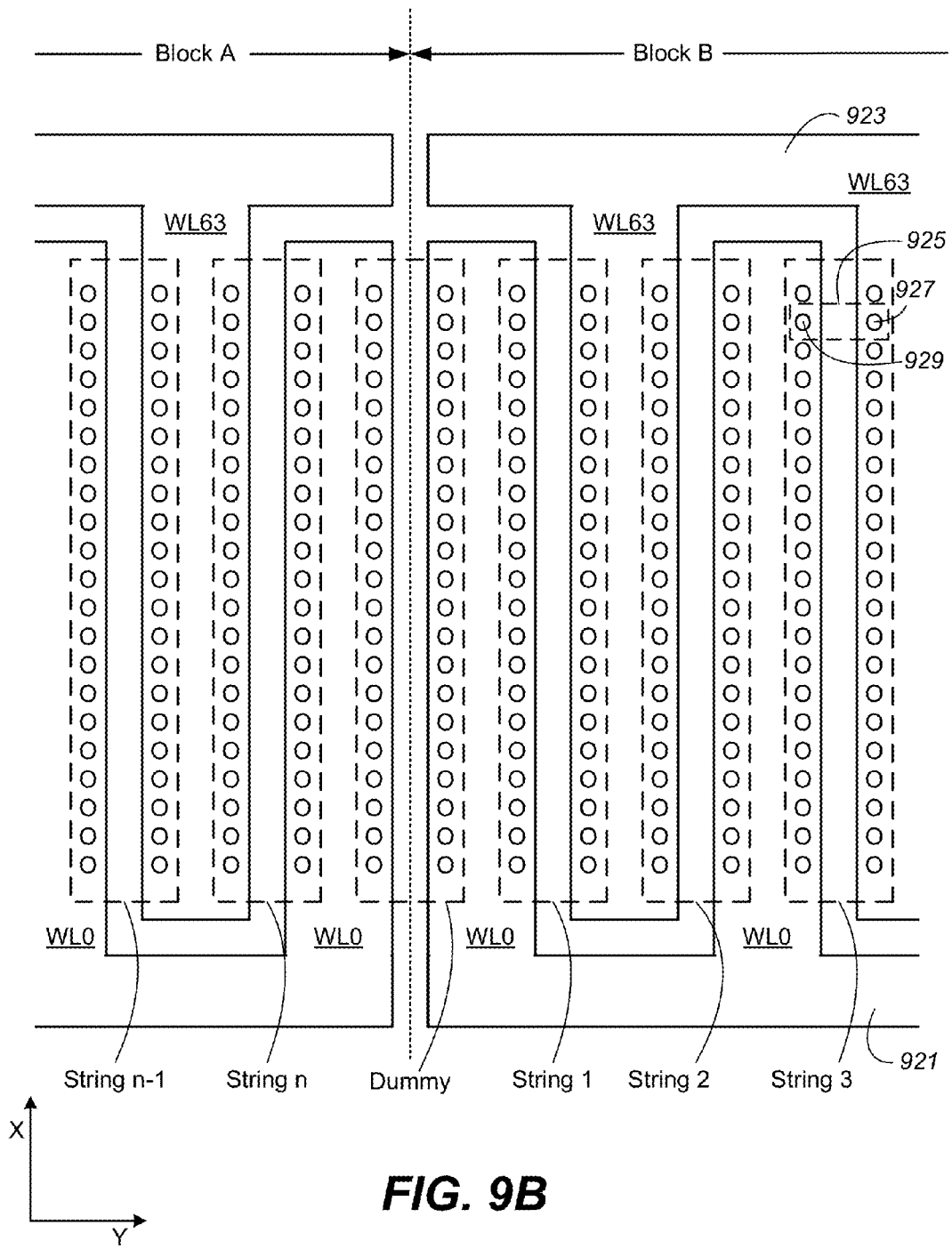
FIG. 9B shows the 3-D NAND memory array of FIG. 9A in cross section along the x-y plane.

The 3-D NAND memory array of FIG. 9A is further illustrated in FIG. 9B, which shows a cross section along A-A' of FIG. 9A (i.e. along the x-y plane that intersects WL0 and WL63). It can be seen that word lines of a block are formed of strips of conductive material that are connected together. Thus, all word lines marked WL0 in different strings of a block are electrically connected together and are formed from a single electrically conductive body 921. Similarly, all word lines marked WL63 in different strings of a block are electrically connected together and are formed from a single electrically conductive body 923. The two bodies that form word lines of a block on a given level appear as interdigitated fingers extending from opposite sides of the block. These two bodies may be separated by Shallow Trench Isolation (STI) dielectric, or by any suitable insulator. A similar pattern may be found at each level of word lines (e.g. WL1 and WL62 are similarly interdigitated, as are WL2 and WL61, and so on). Word lines of different blocks are isolated from each other. Thus, WL0 of Block A is separate, and electrically isolated from WL0 of Block B. Similarly, WL63 of Block A is separate, and electrically isolated from WL0 of Block B.

Memory holes are shown as circles (memory holes are cylindrical in shape and extend in the z-direction, perpendicular to the cross section shown). A U-shaped NAND string 925 extends along two memory holes 927, 929, with one memory hole 927 passing through body 923 and the other memory hole 929 passing through body 921. A set of strings consists of all such strings that are aligned along the x-direction and that share select lines (which also extend along the x-direction). For example, one such set is made up of all strings indicated by "String 3" in Block B, including string 925. When a given set of strings within a block is selected, a selected word line (or portion of a word line, i.e. a subset of the bit lines that intersect the word line) may be read by applying appropriate word line voltages to the selected word line and to unselected word lines.

Word line drivers are connected to supply appropriate voltages to connected word lines of a block (e.g. to bodies 923 and 921) so that a word line of the block can be accessed (e.g. programmed or read). Select line drivers are connected to supply appropriate voltages to select lines so that a particular set of strings in a block is selected.

In general, 3-D memories have more failure modes than 2-D memories because of the proximity of components near memory cells in the vertical direction as well as the horizontal direction. This combined with smaller feature sizes and complex processing needed to produce such small 3-D structures tends to increase the chances that a cell or a group of cells will fail. In many cases these failures are not apparent when data is initially written (i.e. the data is initially written and verified as being within permitted limits). However, when data is later read it may be found to be damaged. For example, the data may be uncorrectable by Error Correction Code (ECC). Such data is sometimes referred to as "UECC" data.

Post Write Read

In some cases, a post write read may be performed at some time after data is programmed, while another safer copy of the data is still available, to confirm that the data is correctly written. This is different from a read-verify step performed during programming and takes place only after some intermediate operations such as programming of other portions of the memory array. In some cases, a word line that is programmed may be affected by subsequent programming of neighboring word lines so that a post write read may be performed after programming of neighboring word lines to ensure that the data has not become UECC or otherwise damaged by the programming of neighboring word lines. Examples of post write read systems and methods are described in U.S. Patent Publications Numbers 20110096601; 20110099460; 20130028021; 20130031429; 20130031430; 20130031431; and in U.S. Pat. No. 8,214,700 which are hereby incorporated by reference in their entirety.

In general, using a post write read operation requires maintaining a safe backup copy of data in a short-term location until it is confirmed that the data is successfully programmed in a long-term location. For example, the short-term location may be in an SLC block where the copy is less likely to be damaged (lower error rate). It is generally desirable to avoid keeping such backup copies for longer than necessary because of the additional space required.

Figure 10:
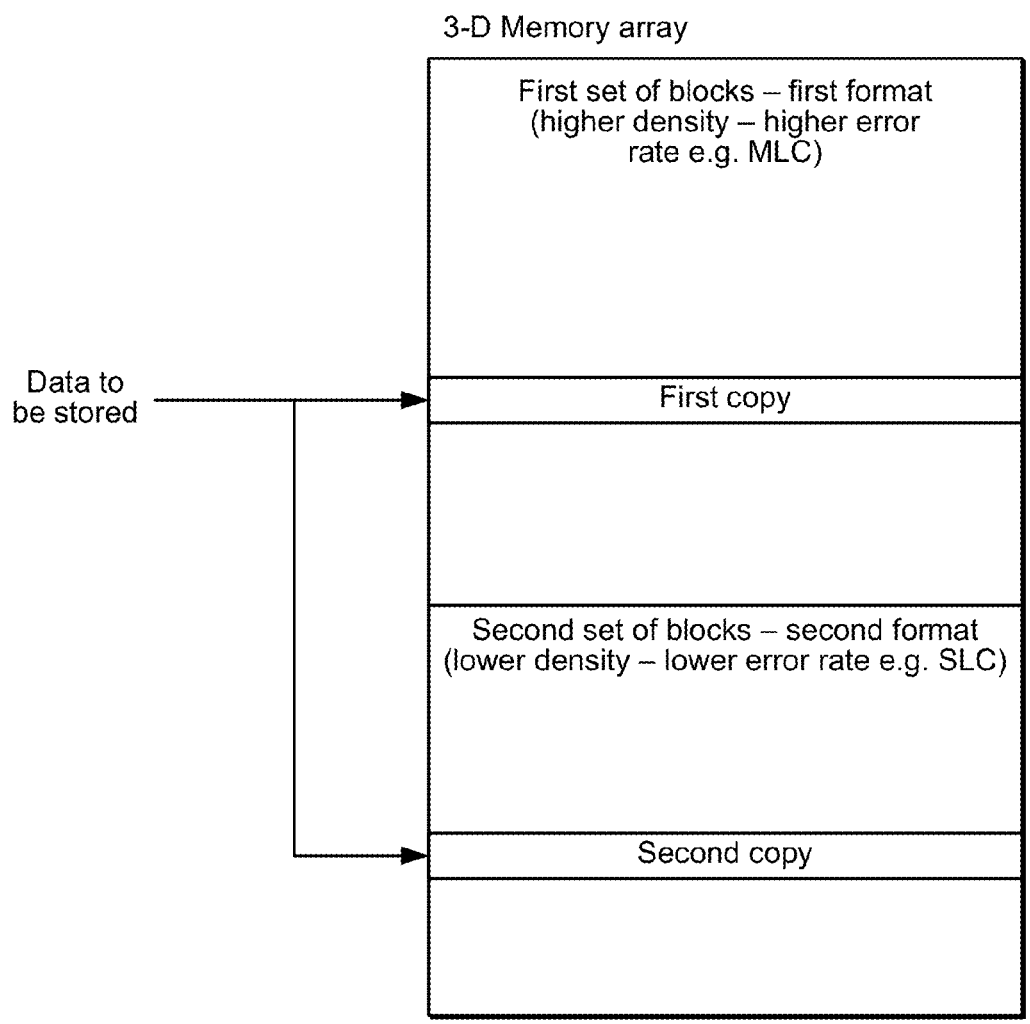
FIG. 10 shows a 3-D memory array having a first set of blocks of a first format and a second set of blocks of a second format.

FIG. 10 illustrates a 3-D memory array that has two sets of blocks, a first set of blocks that store data in a first format, and a second set of blocks that maintain data in a second format. In this example, the first format is a higher density, higher error rate format that is suitable for long term storage and the second format is a lower density, lower error rate format that is suitable for short-term storage. For example, the first format may be MLC and the second format may be SLC. Alternatively, the first format may be MLC with a higher number of bits per cell and the second format may be MLC with a smaller number of bits per cell (e.g. the first format may store three bits per cell "TLC" and the second format may store two, or the first format may store four bits per cell and the second format may store two or three bits per cell). In some cases, a block may be configured for MLC operation with more than two memory states but may then be operated using a subset of the configured states. For example, a block may be configured to store two bits per cell using four memory states and then only store one bit per cell by using just two of the available memory states. In some cases, individual blocks may be configured to store data in either format so that a block may be in the first set of blocks at one time and may be in the second set of blocks at another time. Such dynamic assignment may assign blocks to the first set or second set as needed from a common pool of blocks (e.g. an erased block pool). In other cases, the assignment of blocks to the first set and the second set is static so that an individual block remains in one set throughout the product lifetime. In some examples, the blocks of different sets may be physically different so that a block is permanently assigned based on its physical structure.

When the data is received (e.g. from a host or memory controller) a copy of the data is stored in both formats. A first copy of the data is stored in the first set of blocks in the first format and a second copy of the data is stored in the second set of blocks in the second format. These copies may be stored in any order (e.g. first copy first, or second copy first, or in parallel). The labels "first" and "second" do not necessarily indicate order of storing or other order.

The second copy acts as a backup copy in case the first copy is damaged by subsequent operations so that the data is not lost if the first copy becomes UECC. At some time after the first copy is written, and after the danger of damage to the first copy has passed or dropped significantly, the first copy is checked to determine whether it is acceptable or not. For example, if the first copy is written along a particular word line, it may be checked after neighboring word lines are fully programmed. In an example, the first copy is checked only after the block containing the first copy is fully written. In general, data stored in a block, particularly a 3-D MLC block is subject to disturbance from subsequent write operations directed to other portions of the block. Once such write operations are completed, the risk of disturbance drops significantly. Maintaining the second copy after this time may not provide significant additional benefits. Therefore, in some examples, the first copy is checked after the block containing the first copy is fully written. In general, the block is checked as a unit when it is fully written. A backup copy of the data in the block may be contained in blocks that are dedicated to data of the block (e.g. two SLC blocks to backup a two-bit-per-cell MLC block). This arrangement is convenient for subsequent block reclaiming.

Sampling

Various schemes may be used to check that stored data is acceptable. The data may be subject to a conventional read operation, or a read operation using read parameters that are specific for such a checking operation. Data may be subject to ECC or other checking. In one example, stored data is compared with a backup copy to determine how many bits are different. This provides a relatively quick and simple check that may be performed on-chip (i.e. on the memory chip, without sending the data to a memory controller or other external circuit). For example, it may be assumed that the second copy of FIG. 10 contains a much lower number of errors than the first copy so that any differences between these two copies may be assumed to be from the first copy. The two copies may be compared and the total number of bits that are different may be determined. This number may then be compared with a threshold number to determine whether the first copy meets a certain standard or not. In general, an acceptable number of errors is lower than the limit of ECC correction, and may be significantly lower than the limit of ECC correction so that the first copy is not close to becoming UECC.

In general, it is desirable to check data rapidly because the memory may be unavailable for other operations while checking is performed. However, checking the data in a 3-D memory block, and particularly an MLC block, may require significant time and resources. According to an aspect of the present invention, data in a block may be sampled and the sample data may be used to indicate whether the data stored in the block is acceptable or not. In particular, by using an appropriate sampling pattern, most likely failure modes would be represented in the sample data if they occur.

Figure 11A:
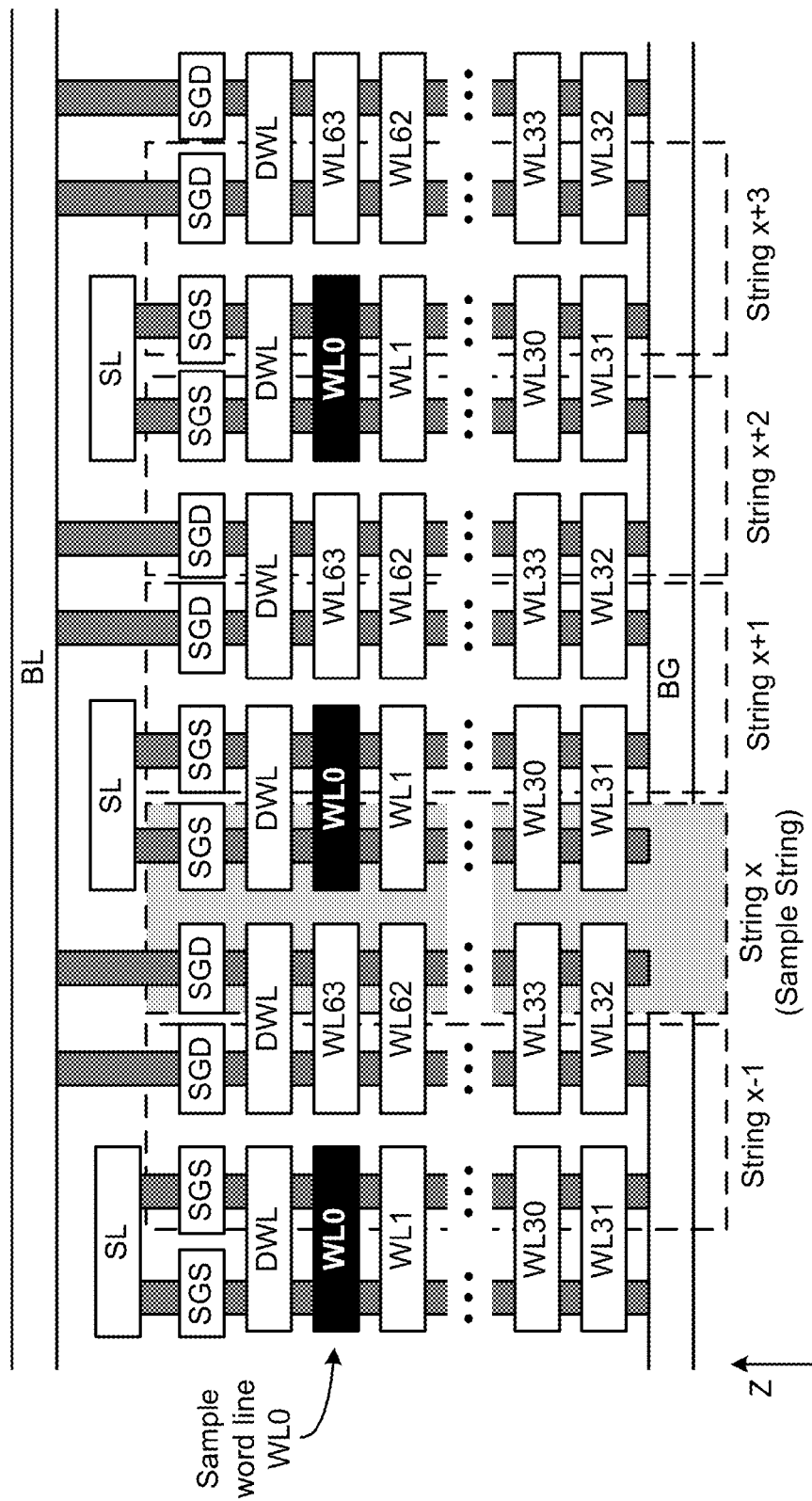
FIG. 11A illustrates a sampling pattern for sampling data of a block to ensure it meets a standard.

FIG. 11A shows a cross section of a portion of a block in a 3-D memory array as previously described. The block may contain any suitable number of individually selectable sets of strings and it will be understood that the strings shown may be at any location within the block. String x is chosen as a sample string. String x may be chosen at random, or based on some expectation that string x is more likely to have disturbed data.

For example, where data is written in order of strings, the sample string could be the first string that is written first because this would generally be the string that suffers most wear, and which is most likely to suffer from data retention problems. Strings near the boundaries with other blocks may be chosen because of the likelihood of damage from neighboring blocks in some examples. In other cases, strings near the boundaries may be safer because of dummy elements incorporated along boundaries so that a sample string may be chosen at some interior location where there are active elements on both sides (as shown in FIG. 11A).

Within sample string x, each word line is checked. This means that at least some data is read from each word line in string x (i.e. WL0 to WL63 of string x). In some cases, only some of the data along a word line is needed. For example, where MLC data is stored as lower page data and upper page data, it may be sufficient to read the upper page data only. In general, if the upper page data is not corrupted, the lower page data stored in the same cells is not corrupted so that it may not be necessary to read the lower page data. In some examples, both lower and upper page data are read. In some cases there may be more than two bits per cell (e.g. three bits per cell) so that there may also be one or more middle pages. These middle pages may be read or not read. It will be understood that by reading upper page data, every memory cell in string x may be read so that likely failure modes are detected.

It will be understood that because word lines of different strings of a block are connected together in this memory design, checking all word lines in one string provides a good indication that there are no shorted word lines in the block. For example, a short between WL30 and WL31 would likely result in a high number of errors when string x is read. Such a short may be located anywhere in the block but may be detected from reading one string.

Certain failure modes are specific to a set of strings. For example, select lines are specific to a set of strings and so failure modes associated with select lines are generally specific to a particular set of strings. Thus, it may not be sufficient to sample just one string because there may be other string-specific failures.

According to an aspect of the present invention, a sample word line is identified and is sampled in each string of the block. For example, in FIG. 11A, WL0 is identified as the sample word line. Data along WL0 is checked in each string of the block. This may mean reading upper page data, or upper and lower page data, and may or may not include reading middle page data (if any). By sampling at least one word line in each string of the block, string specific failures are indicated. In many cases, writing proceeds from word line to word line in a predetermined order. For example, writing may start with WL0 and proceed to WL1, then WL2, and so on to WL63. Because WL0 is the first word line to be written, it is the most worn word line and is subject to the most disturbances from subsequent writes to other word lines and is the most likely to suffer from data retention problems. This makes WL0 a good candidate as a sample word line. The sample word line may be a different word line if a different order is used.

While this example shows the same word line WL0 being sampled in each string, different word lines could be used (e.g. WL5 of string x+1, WL30 of string x+2). In general at least one word line should be sampled in each string even if it is not the same word line. According to another example, word lines of a block are sampled according to a diagonal pattern that proceeds from string to string so that each group of commonly connected word lines in a block (WL0, WL1, WL2 . . . etc.) is sampled in at least one string, and each string is sampled along at least one word line.

Figure 11B:
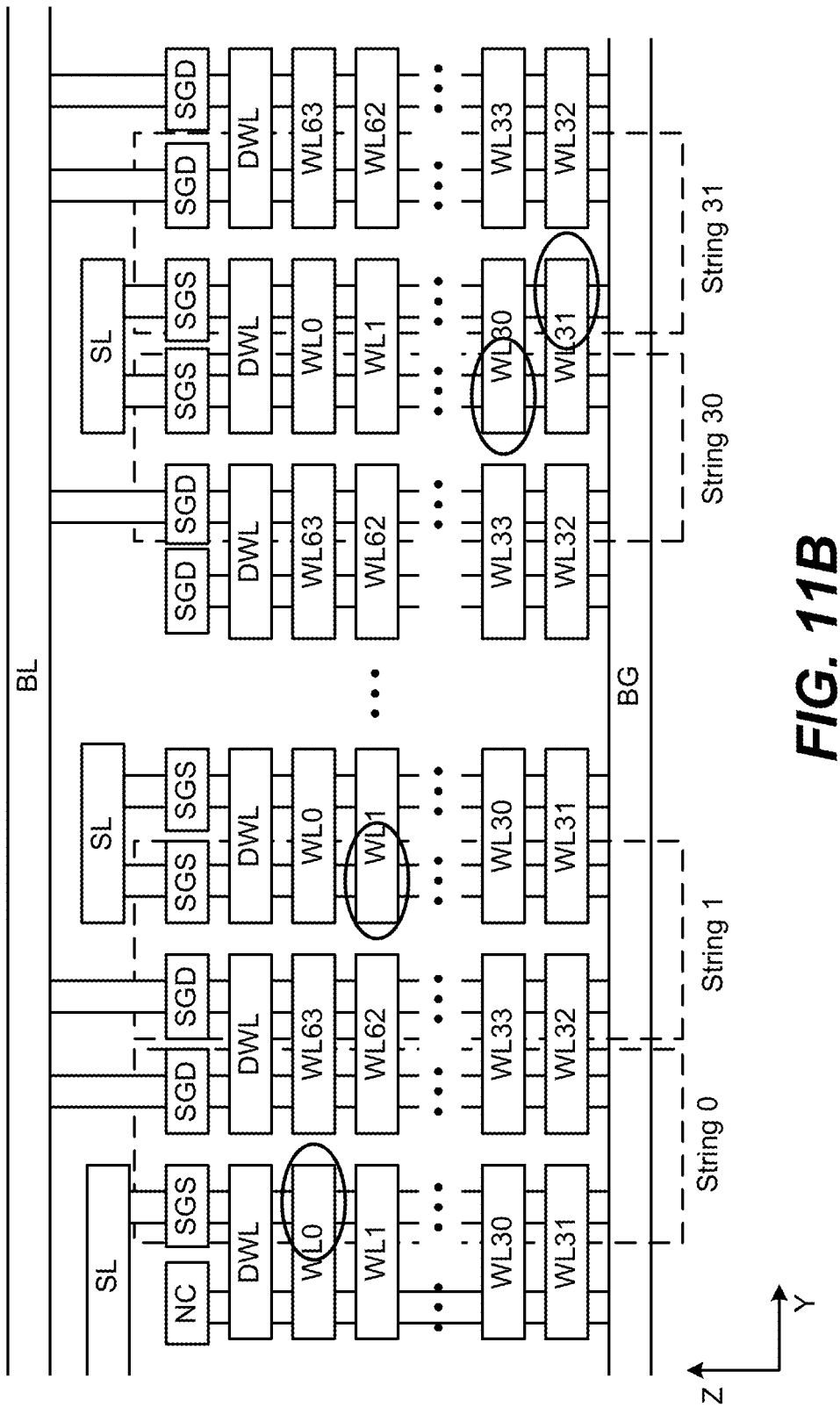
FIG. 11B illustrates another example of a sampling pattern for sampling data of a block to ensure that it meets a standard.

FIG. 11B shows sampling according to a diagonal sampling pattern so that WL0 is sampled in string 0, WL1 is sampled in string 1 and so on. Sampled word lines are circled. It will be understood that two word lines are formed from a single conductive strip of material and that only one such word line may be sampled according to a particular pattern. FIG. 11B shows WL30 being sampled in string 30 while WL 30 of string 31, which is formed of the same conductive strip of material, is not sampled. WL31 of string 31 is sampled instead.

In many cases, the number of word lines in a sting is different to the number of strings in a block so that a single pass diagonal sampling pattern is not sufficient. For example, FIG. 11B shows 64 word lines (WL0-WL63) per string but only 32 strings (string 0-string 31) in the block. In such cases, multiple passes may be made so that some or all strings may be sampled more than once. While not shown in FIG. 11B, WL32-WL63 may be sampled in strings 0-31 by sampling a second word line in each string (e.g. WL32 of string 0, WL33 of string 1, and so on). In other cases, where there are more strings per block than word lines per string, some or all groups of commonly connected word lines may be sampled more than once.

Figure 11C:
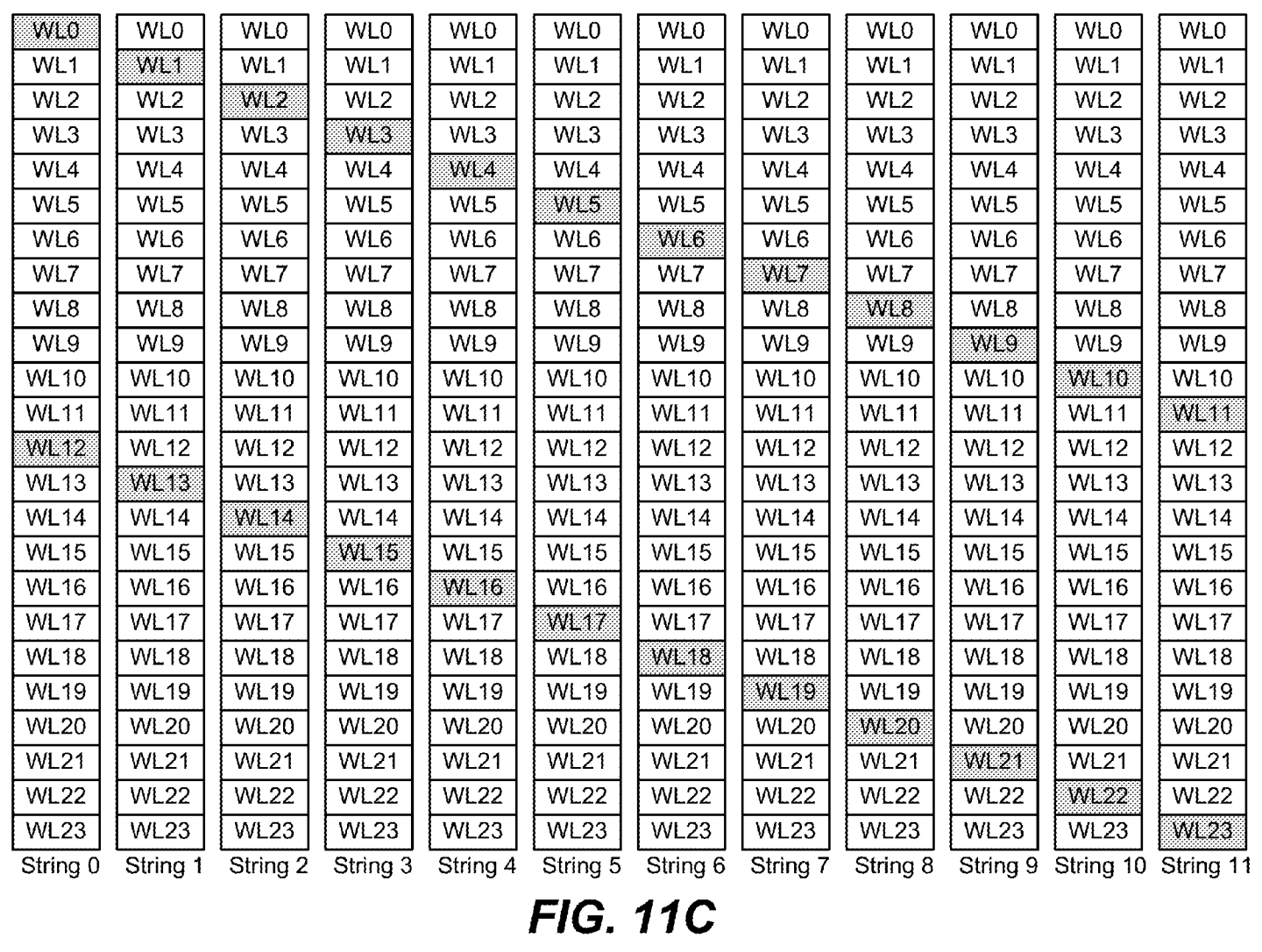

FIG. 11C shows a schematic of a two-pass diagonal sampling arrangement with sampled word lines shown by shading. (While this schematic representation shows strings as straight, it may apply to strings of any geometry including U-shaped strings.) A first pass samples one word line from each string starting with WL0 of string 0, then WL 1 of string 1, and so on (word line n from string n). At the end of the first pass, each string (0-11) has been sampled. However, because there are more word lines per string than there are strings in the block, there are additional groups of commonly connected word lines (WL12-WL23) which have not been sampled. Accordingly, a second pass proceeds from WL12 of string 0, to WL13 of string 1, and so on (word line n+12 from string n). Alternatively, the second pass could proceed in the opposite direction, starting with WL12 of string 11, then WL13 of string 10, and so on (word line n+11 from string 12-n).

While the diagonal patterns described above may be convenient, it will be understood that other patterns may also be used to sample at least one word line in each string, and to sample at least one word line for each group of commonly connected word lines (i.e. at least one WL0 per block, at least one WL1 per block, etc.). It is not necessary to increment word line and string coordinates together by similar increments. A more randomized pattern may be used, or a pattern may be adapted to patterns of wear (e.g. cycle count), may be adapted to patterns of observed errors (e.g. sampling at locations found by ECC to have more errors), or may be adapted to other patterns that occur in such a three dimensional block such as patterns resulting from the physical location of the block. Furthermore, it will be understood that the sampling can proceed in any order, i.e. it does not have to start with WL0, or string), and does not have to proceed in order of increasing word line number or string number.

In general, if data of a block is sampled as indicated in FIG. 11 and the sample data is acceptable, then all the data stored in the block may be considered acceptable without checking all of it. This provides a significant saving as compared with reading all the data in the block. For example, where there are n strings in a block and y word lines per string, the total number of word lines in the block is n*y. However, the number of sample word lines is y+(n−1). In the example of FIG. 11, y=64, and n may be 12, so that the number of sample word lines is 75 (of 768 word lines in the block). This means reading only about 10% of the block and thus represents a significant time saving. For higher values of n, the saving may be even greater.

Checking the sample data may include comparing the sample data with corresponding portions of the backup copy of the data to determine how many bad bits are in the sample data. If the number of errors is small (not more than a threshold number) then the backup copy may be discarded (thus freeing up at least two blocks). If the number of errors is large (more than the threshold number) then the block containing the sample data may be discarded and a new copy of the data may be written in the first format (high density), using the backup copy as a source.

Figure 12:
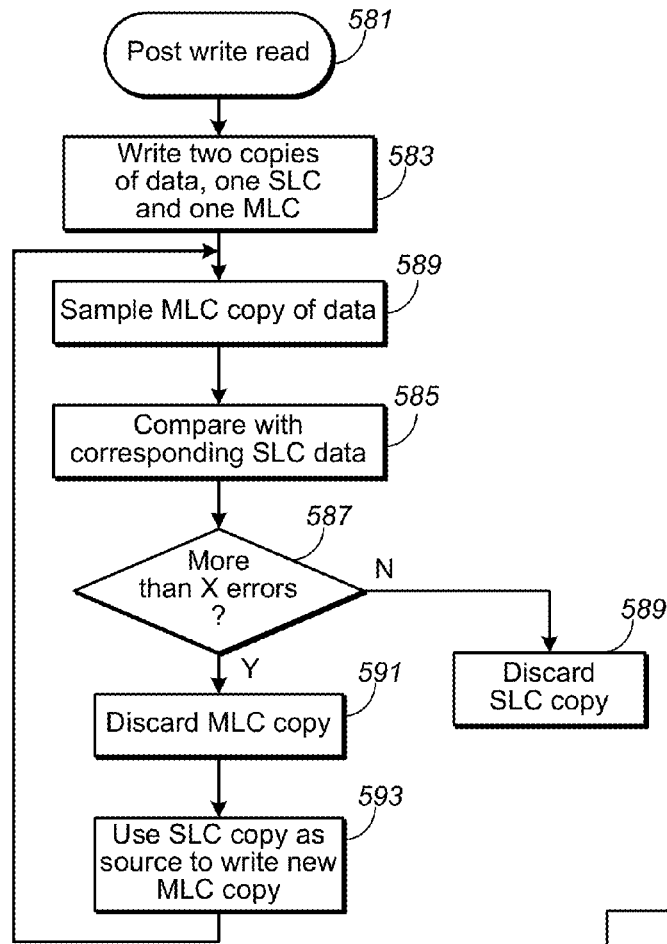
FIG. 12 illustrates a method of using a post write read to ensure MLC data meets a standard.

FIG. 12 is a flowchart showing an example of how a post write read technique 581 may be applied to a memory with SLC and MLC blocks as previously discussed. When data is received, two copies of the data are written, one copy in SLC and one copy in MLC 583. Subsequently, additional data may be stored in the memory as part of the same write command or additional write commands, and other operations may occur. Subsequently, a post write read is triggered and the MLC copy of the data is sampled 589 so that each word line of a sample string is checked and a word line of each string is checked. The sample data is compared with the corresponding data of the SLC copy 585 to determine the number of errors in the MLC copy. The number of errors is compared with a threshold number X. If the number of errors is not more than X, then the SLC copy (or backup copy) is discarded 589. If the number of errors is more than X then the sampled MLC block is discarded 591. Then, the SLC copy (backup copy) is used as a source to write a new MLC copy of the data 593. This new MLC copy may then be subject to the same checking process to ensure that it is acceptable.

Block Selection

In some cases, two or more blocks may share block select circuits. Examples of such shared block select circuits are shown in U.S. Patent Publication No. 2011/0267885. Such paired, or grouped (may more than two) blocks may have particular failure modes that affect a pair or group of blocks as a unit.

Figure 13:
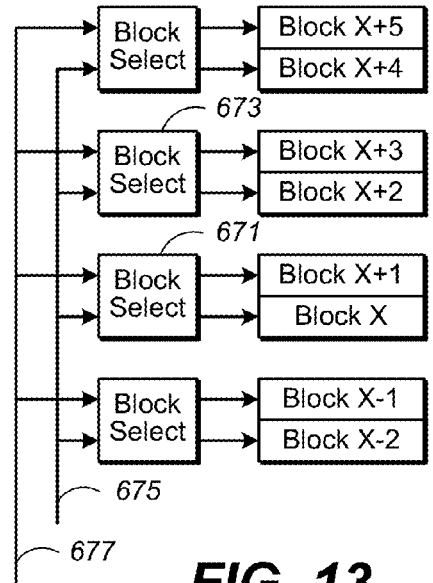
FIG. 13 illustrates an example of blocks sharing block select circuits.

FIG. 13 shows an example of paired blocks, where each pair of blocks shares a block select circuits. For example, Block X and Block X+1 share a block select circuit 671. Block X+2 and Block X+3 share a block select circuit 673, and so on. When particular data is accessed, a particular word line, set of strings containing the word line, and block containing the set of strings are selected. Block select circuits connect word lines of the selected block (e.g. Block X) to first global word lines 675 that are biased appropriately with read and read-pass voltages. The shared block select circuits 671 connect word lines of the unselected paired block (e.g. Block X+1) to separate second global word lines 677 that are biased to some low voltage. In some cases, a short or leak between blocks may affect reads in both blocks. For example, it can be seen from FIG. 9A that a short or leak between WL0 of Block X and WL0 of Block X+1 could occur if insulation between blocks was insufficient. Because of the connected word lines within a block, such a defect would affect all strings of the two blocks. For example, in order to read a word line of a string of Block X, it might be necessary to apply a read-pass voltage to WL0. If WL0 of selected Block X leaks to WL0 of unselected Block X+1 (which is typically at some lower voltage than the read-pass voltage) then the effective voltage on WL0 of Block X may not be sufficient to make memory cells along WL0 conductive and may result in UECC data throughout Block X and Block X+1. For blocks that are not paired, word lines of the unselected block would generally be floating (isolated from global word lines) and leakage to such word lines would not significantly affect voltages applied to the selected block.

While this example refers to word lines, shorting of other elements between blocks may also result in UECC data throughout a pair of blocks, for example if back gates of two blocks are shorted this can cause data in both blocks to be UECC. A short between select lines in neighboring blocks that share block select circuits can prevent proper biasing of select lines of both blocks thus making data in both blocks UECC. (A short between select lines of neighboring blocks that do not share block select circuits generally only affects two strings on each block).

According to an aspect of the present invention, pairs or groups of blocks that share block select circuits may be operated together for post write read purposes. In general, a post write read is performed on a block after the block is full (and is less likely to undergo further disturbance). Where blocks are paired, post write reads may be performed on a pair of blocks only after both blocks in the pair are full. Then, the two blocks may be sampled together using a sample pattern as described above. All word lines of one set of strings in each block may be sampled (e.g. one set of strings from block X and one set of strings from block X+1). One word line may be sampled from each set of strings in each block (e.g. WL0 from each string of block n, and WL0 from each string of block X+1).

Figure 14:
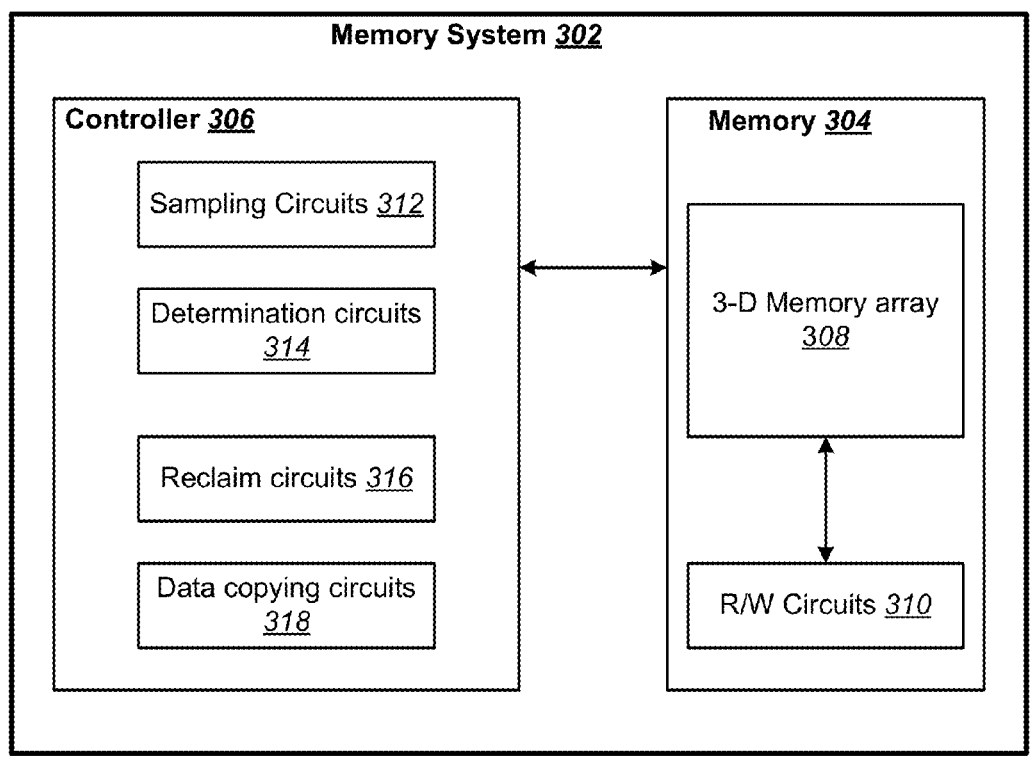
FIG. 14 shows an example of 3-D memory hardware.

Various hardware may be used to implement aspects of the present invention. FIG. 14 shows an example of hardware that may be used. A memory system 302 includes a memory die 304 and a memory controller die 306. Memory die 304 includes a 3-D memory array 308 that includes individually erasable blocks, which may be paired so that paired blocks share block select circuits. The memory has two portions, a higher density higher error rate portion (e.g. MLC portion), and a lower density lower error rate portion (e.g. SLC portion). Memory dies 304 also includes read/write circuits 310 which access the memory array to read and write data. Memory controller 306 includes sampling circuits 312 that are responsible for sampling word lines of blocks according to a sampling pattern. Determination circuits 314 may determine whether sampled data meets a standard. For example determination circuits 314 may compare the sampled data from a block in the high error rate portion with corresponding data in the low error rate portion to determine how many errors are in the sampled data. Determination circuits 314 may then compare this number of errors with a threshold value to see if the sampled data meets a standard. Reclaim circuits 316 are responsible for identifying blocks that can be reclaimed. For example, when a high error rate block is found to meet the standard then corresponding data in low error rate blocks is no longer needed for backup which may make one or more low error rate blocks available for reclaim. Where a high error rate block does not meet the standard then the high error rate block may be made available for reclaim. In this case, data copying circuits 318 are provided to read backup data from the low error rate portion and copy it into a new block in the high error rate portion. It will be understood that various additional circuits, including those shown in FIG. 1 and others, may also be provided. The hardware is provided as an example and other hardware may be used (for example providing some of the circuits on the memory die, or on a separate die, instead of on a controller die).

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of operating a three dimensional nonvolatile memory formed as a plurality of physical levels of memory cells disposed above a substrate comprising:
writing data in a first format in a plurality of separately selectable sets of strings of a first block;
writing the data in a second format in at least a second block;
subsequently sampling the data written in the first format from the first block, sample data including: (i) data of all word lines of a sample set of strings and (ii) data of a sample word line of each of the sets of strings of the plurality;
if the sample data meets a standard, then discarding the data written in the second format in the at least a second block; and
if the sample data does not meet the standard, then discarding the data in the first format in the first block.

2. The method of claim 1 further comprising, if the sample data does not meet the standard, then using the data in the second format from the at least a second block as a source to write the data in the first format in a third block.

3. The method of claim 1 wherein the standard requires that fewer than a threshold number of bits of the sample data are different to corresponding bits of the data written in the second format in the at least a second block.

4. The method of claim 1 wherein the first format is a Multi Level Cell (MLC) format that stores n-bits per cell, where n=2, 3, 4, or more, and the second format is a Single Level Cell (SLC) format or an MLC format that stores fewer than n-bits per cell.

5. The method of claim 1 wherein the first format includes a lower bit and an upper bit in a memory cell and the sample data includes both lower bits and upper bits.

6. The method of claim 1 wherein the first format includes a lower bit and an upper bit in a memory cell and the sample data consists of upper bits.

7. The method of claim 4 wherein the first format stores n-bits per cell in the first block and the at least a second block consists of n Single Level Cell (SLC) blocks.

8. The method of claim 1 wherein word lines in a set of strings are written in a predetermined order and the sample word line is the first written word line according to the predetermined order.

9. The method of claim 1 wherein the first block shares a block select circuit with a third block, and the first and third blocks are sampled together after they are both fully written in the first format, the third block sampled such that sample data includes: (i) data of all word lines of a sample set of strings of the third block and (ii) a sample word line of each set of strings of the third block.

10. A three dimensional nonvolatile memory formed as a plurality of physical levels of memory cells disposed above a substrate comprising:
a plurality of individually erasable blocks, a block including a plurality of strings connected to each bit line of the block, each string along a bit line being selectable by a different select line so that an individual select line selects a set of strings of different bit lines;
a write circuit that is configured to write data in a first set of blocks in a first format and to write the data in a second set of blocks in a second format;
a sampling circuit that is configured to sample the data in the first format from a block of the first set of blocks, sample data including (i) data of all word lines of a sample set of strings in the block, and (ii) data of a sample word line of each set of strings of the block;
a determination circuit that is configured to determine whether the sample data meets a standard; and
a block reclaim circuit that is configured to reclaim a portion of the second set of blocks containing the data in the second format if the sample data meets the standard, and configured to reclaim a portion of the first set of blocks containing the data in the first format if the sample data does not meet the standard.

11. The three dimensional nonvolatile memory of claim 10 further comprising a data copying circuit that is configured to use the data in the second format in the second set of blocks as a source to write the data in the first set of blocks in the first format.

12. The three dimensional nonvolatile memory of claim 10 wherein the determination circuit is configured to compare the sample data with corresponding portions of data from the second set of blocks to identify a number of bits that are different and to compare the number with a threshold number.

13. The three dimensional nonvolatile memory of claim 10 wherein the first format is a Multi Level Cell (MLC) format that stores n-bits per cell, where n=2, 3, 4, or more, and the second format is a Single Level Cell (SLC) format or an MLC format that stores fewer than n-bits per cell.

14. The three dimensional nonvolatile memory of claim 10 wherein the first format includes a lower bit and an upper bit in each memory cell and the sampling circuit is configured to sample both lower bits and upper bits.

15. The three dimensional nonvolatile memory of claim 10 wherein the first format includes a lower bit and an upper bit in each memory cell and the sampling circuit is configured to sample only upper bits.

16. The three dimensional nonvolatile memory of claim 10 wherein word lines in a set of strings are written in a predetermined order and the sample word line is the first written word line according to the predetermined order.

17. The three dimensional nonvolatile memory of claim 10 wherein the plurality of individually erasable blocks are arranged in pairs, with each pair of blocks sharing a block select circuit, and wherein the sampling circuit is configured to sample the data in the first format from a pair of blocks together such that sample data includes: (i) data of all word lines of a sample set of strings in each block and (ii) a sample word line of each set of strings of each blocks.

18. A method of operating a three dimensional nonvolatile memory formed as a plurality of physical levels of memory cells disposed above a substrate comprising:
writing data in a Multi Level Cell (MLC) format that stores n-bits per cell, where n=2, or more, in a plurality of separately selectable sets of strings of a first block;
writing the data in a Single Level Cell (SLC) format in at least a second block;
subsequently sampling the data written in the MLC format from the first block, sample data including: (i) upper page data of all word lines of a sample set of strings and (ii) upper page data of a sample word line of each of the sets of strings of the plurality;

if the sample data meets a standard, then discarding the data written in the SLC format in the at least a second block; and if the sample data does not meet the standard, then discarding the data in the MLC format in the first block and using the data in the SLC format from the at least a second block as a source to write the data in the MLC format in a third block.

19. A three dimensional nonvolatile memory formed as a plurality of physical levels of memory cells disposed above a substrate comprising:

a plurality of individually erasable blocks, a block including a plurality of strings connected to each bit line of the block, each string along a bit line being selectable by a different select line so that an individual select line selects a set of strings of different bit lines;

a write circuit that is configured to write data in a first set of blocks in a Multi Level Cell (MLC) format that stores n-bits per cell, where n=2, or more, and to write the data in a second set of blocks in a Single Level Cell (SLC) format;

a sampling circuit that is configured to sample the data in the MLC format from a block of the first set of blocks, sample data including (i) data of all word lines of a sample set of strings in the block, and (ii) data of a sample word line of each set of strings of the block;

a determination circuit that is configured to determine whether the sample data meets a standard; and a block reclaim circuit that is configured to reclaim a portion of the second set of blocks containing the data in the second format if the sample data meets the standard, and configured to reclaim a portion of the first set of blocks containing the data in the MLC format if the sample data does not meet the standard.

20. The three dimensional nonvolatile memory of claim 19 further comprising a data copying circuit that is configured to use the data in the SLC format in the second set of blocks as a source to write the data in the first set of blocks in the MLC format.

21. The method of claim 1 wherein data in the first block that is not sample data is not checked prior to discarding the data written in the second format in the at least a second block or discarding the data in the first format in the first block.

22. The method of claim 21 wherein the sample data is less than 10% of the data in the first block.

23. The method of claim 18 wherein word lines in a set of strings are written in a predetermined order and the sample word line is the first written word line according to the predetermined order.

24. The three dimensional nonvolatile memory of claim 19 wherein word lines in a set of strings are written in a predetermined order and the sample word line is the first written word line according to the predetermined order.

* * * * *